United States Patent [19]

Wang

[11] 4,314,209

[45] Feb. 2, 1982

[54] Q-ENHANCED RESONANCE-STABILIZED MASER

[75] Inventor: Harry T. M. Wang, Thousand Oaks, Calif.

[73] Assignee: Hughes Aircraft Company, Culver City, Calif.

[21] Appl. No.: 141,846

[22] Filed: Apr. 21, 1980

[51] Int. Cl.³ .............................................. H03L 7/00
[52] U.S. Cl. ...................................... 331/3; 331/94.1
[58] Field of Search ...................................... 331/3, 94

[56] References Cited

FOREIGN PATENT DOCUMENTS 149151 11/1952 Australia ................................. 331/3

Primary Examiner—Stanley T. Krawczewicz
Attorney, Agent, or Firm—Robert M. Wallace; William H. MacAllister

[57] ABSTRACT

Self-sustained oscillation of the atoms in a maser is achieved in a cavity of reduced size by in-phase feedback for cavity Q-enhancement. Cavity resonant frequency is stabilized using a small reactive element coupled to the maser cavity. The reactance of the small element is precisely controlled so that the resonant frequency of the cavity is stabilized with reference to the radiation frequency of the atoms inside the maser cavity by a feedback control loop using the maser radiation as a reference signal.

17 Claims, 3 Drawing Figures

Q-ENHANCED RESONANCE-STABILIZED MASER

The Government has rights in this invention pursuant to Contract No. N00014-78-C-0139 awarded by the Department of the Navy.

TECHNICAL FIELD

This invention is related to atomic clocks using a maser cavity much smaller than the size of an optimal low loss cavity in which self-sustained oscillation is required and in which fluctuations of the cavity resonant frequency must be compensated.

BACKGROUND OF THE INVENTION

Atomic clocks using a hydrogen maser (a device for Microwave Amplification by Stimulated Emission of Radiation) are well known in the art. The microwave radiation of the hydrogen atoms in the maser cavity is coherent and, if losses in the cavity are sufficiently low, self-sustained oscillation can be obtained if the resonant frequency of the cavity is substantially equal to the frequency of the atomic radiation, namely 1420.405751 MHz. Such a maser cavity is typically 28 centimeters in diameter and 28 centimeters in length. A clock signal may be generated by referencing the phase of a voltage controlled oscillator to the microwave radiation of the maser in a feedback control loop. A major disadvantage of such an atomic clock is that it is bulky due to the large (28 centimeters) size of the maser cavity.

If the size of the maser cavity is reduced in an effort to miniaturize the atomic clock, the losses in the cavity will increase to the extent that self-sustained oscillation cannot be achieved. Therefore, external radiation stimulation is required to obtain the atomic resonance signal. However, the frequency and amplitude of the external stimulation have to be precisely controlled to prevent distortions of the atomic resonance signal and consequent frequency shifts of the clock output. One solution to this problem is described in U.S. Application, Ser. No. 043,075 filed May 29, 1979 by the Applicant of this application, entitled "Atomic Frequency Standard Using Free Induction Technique", and assigned to the assignee of this application. One disadvantage of the free induction technique of the above-referenced patent application is that measurements of the maser radiation are performed by the clock electronics periodically instead of continuously so that the signal-to-noise ratio of the referenced maser radiation is limited by the duty cycle of the measurements. Therefore, it has been a long standing problem in the art that miniaturization of a maser atomic clock requires external stimulation which either introduces signal distortion, or, as in the above-referenced patent application, reduces the duty cycle of the clock electronics, thereby decreasing the signal-to-noise ratio of the system.

Another problem area in maser atomic clocks is the limited stability of the resonant frequency of the microwave cavity. Since the cavity and atoms form a coupled pair of oscillators, changes in cavity resonant frequency will produce systematic variations in the measured atom transition frequency and, hence, in the output of the frequency standard. Previous maser cavity designs relied on thermal and mechanical means for cavity frequency stabilization. These designs are susceptible to long term drift due to material creep and thermal control system variations.

Therefore, it has been a desirable goal in the art to provide a maser having a cavity with a stable resonance frequency and of reduced size but in which the atomic oscillation is self-sustained and does not have to be stimulated by an external source.

SUMMARY OF THE INVENTION

The present invention includes a maser having a cavity of reduced size which does not require external stimulation of the atoms inside the maser. Instead, in the present invention, self-sustained oscillation of the atoms in the maser is achieved in a cavity of reduced size by feeding back in phase a portion of the externally amplified maser signal into the cavity. This is equivalent to reducing cavity losses or Q-enhancement. Another feature of the invention is that the resonant frequency of the cavity is stabilized by the addition of a supplementary reactive element to the maser cavity. The reactance of the supplementary element is precisely controlled in a separate feedback control loop using a reference signal derived from the maser radiation.

In the preferred embodiment of the invention, the maser is a hydrogen maser emitting coherent 1420.405751 MHz radiation by the hydrogen atoms. Cavity frequency stabilization is achieved by means of a varactor diode connected to the cavity as a tunable element reactively loading the cavity. The varactor diode may be of the same type currently used in color television automatic tuning circuits. The diode junction voltage is precisely controlled so that the cavity is resonant at the frequency $f_o$ of the hydrogen atoms, namely 1420.405751 MHz. The diode junction voltage is controlled in a feedback loop by an error signal which is generated by comparing the cavity responses to two test signals, the two test signals having their frequencies, $f_1$, $f_2$, phase-locked to the atomic radiation frequency $f_0$ and symmetrically straddling it. The test frequencies, $f_1$, $f_2$ are filtered out of the maser signal before it is used by clock electronics to generate a clock signal. An electrical clock signal is generated from the output clock signal by forcing the phase and frequency of a voltage controlled oscillator to equal that of the maser output signal in a feedback control loop.

The main advantages of the invention are: (1) The maser cavity size may be reduced well below the usual 28 centimeter size of hydrogen maser cavities while maintaining the self-sustained oscillation of the hydrogen atoms in the maser cavity so as not to require external stimulation, because a portion of the maser radiation signal is fed back in phase to the maser cavity. (2) The cavity resonant frequency stabilization system, having its reference frequency derived from the atomic radiation frequency, is inherently superior to thermal mechanical designs, thus providing improved long term stability of the maser frequency.

BRIEF DESCRIPTION OF THE DRAWINGS

The invention is best understood by reference to the accompanying drawings, of which.

DETAILED DESCRIPTION OF THE INVENTION

Figure 1:
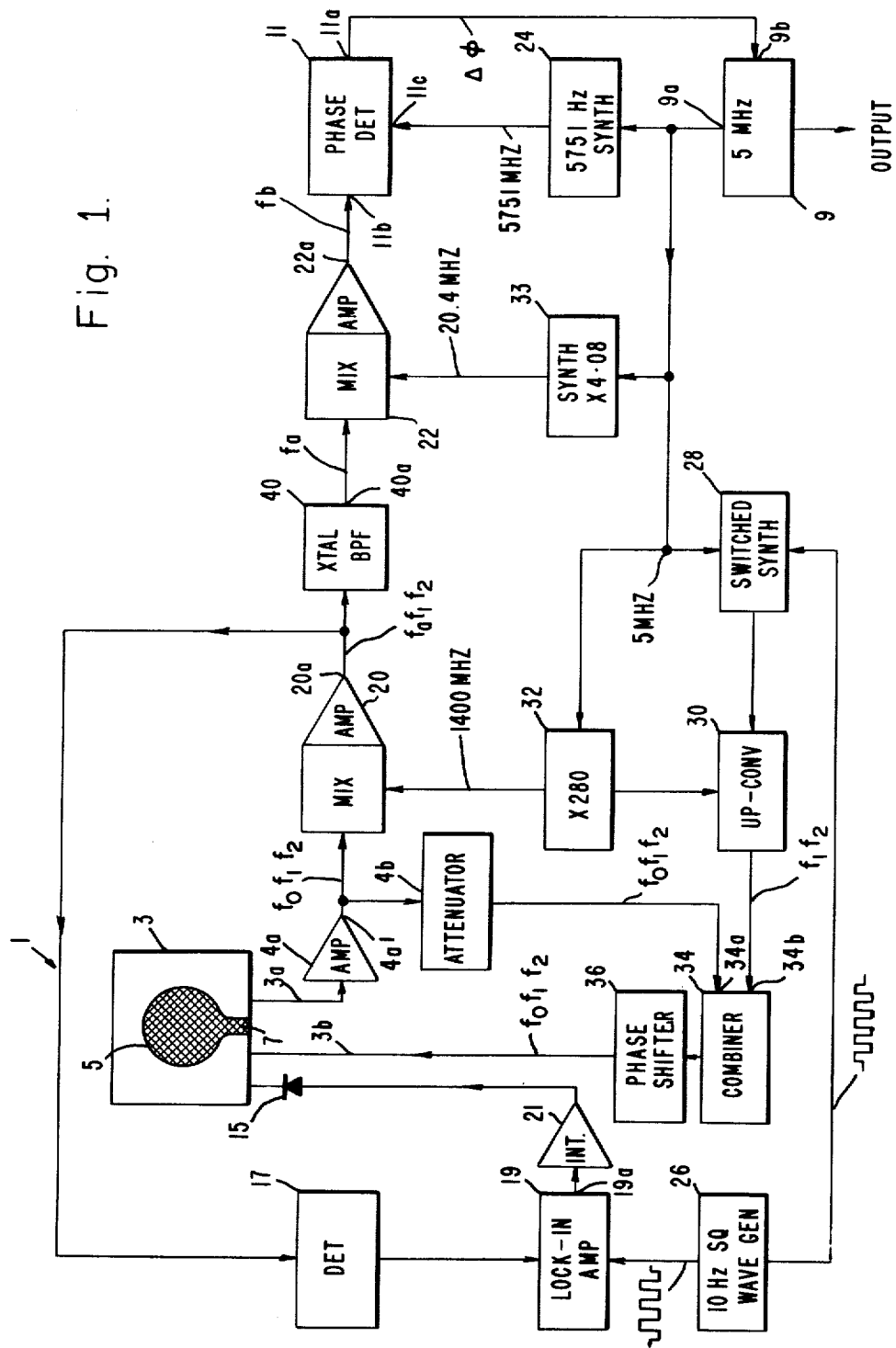
FIG. 1 is a simplified schematic diagram of the preferred embodiment of the present invention.

Referring to the schematic diagram of FIG. 1, a maser 1 includes a microwave cavity 3 enclosing an atomic storage bulb 5 into which hydrogen atoms 7 are introduced. A static magnetic field maintains spin alignments of the hydrogen atoms in a uniform direction to ensure coherent radiation. If losses in the cavity are sufficiently low and its resonant frequency is tuned close to the atomic radiation frequency $f_0$, then power emitted by the hydrogen atoms inside the storage bulb 5 may be large enough to overcome cavity losses so that self-sustained oscillation at the atom transition frequency is obtained. An atomic clock may be provided by comparing the output of a voltage controlled oscillator 9 with the down-converted output of the maser 1 in a phase detector 11 to generate an error signal at the output 11a of the phase detector which controls the frequency of the voltage controlled oscillator. The phase detector and the voltage controlled oscillator comprise a feedback control loop which maintains the output of the voltage controlled oscillator in phase with the maser output radiation.

A disadvantage of such an arrangement is that the size of the maser cavity 3 must be on the order of the hydrogen atomic radiation wavelength of 28 centimeters, which for many applications, such as a clock for a spacecraft or satellite, is considered to be excessively bulky. Unfortunately, if the size of the maser cavity 3 is reduced, its losses become sufficiently large so that the power radiated by the atoms is not sufficient to overcome these losses. Such a reduced maser cavity will not permit self-sustained oscillation of the hydrogen atoms in the bulb 5 so that continuous maser action is not possible without the use of an external source of stimulation. Introduction of external radiation into the maser cavity 3 to stimulate radiation by the hydrogen atoms in the bulb 5 may either cause distortion of the maser output signal or, using the free induction technique of the above-referenced patent application, will result in a loss in signal-to-noise ratio.

The foregoing problems are solved in the present invention by cavity Q-enhancement which is accomplished as follows. The maser output from cavity output port 3a is amplified in an amplifier 4a, the output, 4a', of which is fed back into the cavity 3 at cavity input port 3b through an attenuator 4b, an input port 34a of a power combiner 34 and a phase shifter 36. The amount of feedback is controlled by the attenuator 4b, while the phase shifter 36 is provided to ensure that the feedback is in-phase with the electromagnetic field in the cavity 3. This in-phase feedback has the effect of reducing cavity losses, or increasing cavity Q, so that sustained maser oscillation is obtained despite a reduction in cavity size.

To ensure long term stability of the cavity resonant frequency, this invention also includes a cavity stabilization system using a reactive element 15. In the preferred embodiment, the reactive element 15 is a varactor diode having its anode connected to the wall of the cavity 3. The junction voltage of the diode determines the diode junction capacitance and hence the reactive loading of the cavity 3. Varying the reactive loading of the cavity changes its resonant frequency. Therefore, the junction voltage of the diode 15 may be precisely selected to give the desired cavity resonant frequency. The diode junction voltage is controlled by a reactance feedback control loop referenced to the maser output signal, including a detector 17, a lock-in amplifier 19 and an integrator 21 connected to the cathode of the diode 15. This feedback control loop uses two test signals of frequencies $f_1$ and $f_2$, which are introduced into the microwave cavity 3 through its input 3b, the frequencies $f_1$ and $f_2$ symmetrically straddling the radiation frequency $f_0 = 1420.405751$ MHz so that $f_1 = f_0 - \Delta$ and $f_2 = f_0 + \Delta$. Preferably, both $f_1$ and $f_2$ are near the half-power response frequencies of the cavity 3 and are sufficiently removed by the difference frequency $\Delta$ from the atomic radiation frequency $f_0$ so that the test signals do not distort the detection of the radiation of the hydrogen atoms inside the bulb 5.

It should be noted parenthetically that, as previously discussed, a portion of the maser signal from the output 3a is also fed to the same maser input 3b (through the attenuator 4b) to ensure self-sustained maser oscillation and so performs a function different from that performed by the test signals of frequencies $f_1$, $f_2$. Although the maser output signal fed back through the attenuator 4b contains both the atomic radiation frequency $f_0$ and, unavoidably, the test signal frequencies $f_1$, $f_2$, only the atomic radiation signal of frequency $f_0$ contributes to the maser oscillation.

Briefly, the reactance feedback control loop comprising the detector 17, the lock-in amplifier 19 and the integrator 21 changes the junction voltage on the diode 15 in proportion to an error signal generated by subtracting from one another the responses of the cavity 3 to the two test signals $f_1$ and $f_2$, so that the cavity resonant frequency is maintained exactly half-way between the test signal frequencies $f_1$, $f_2$, near the hydrogen radiation frequency $f_0$, eliminating long term drift problems arising from thermal and/or mechanical fluctuations of the cavity 3.

In the preferred embodiment, the cavity resonant frequency is stabilized at $f_0 = 1420.405751$ MHz by the reactance control loop as follows. Two test signals having frequencies $f_1 = 1420.390751$ MHz and $f_2 = 1420.420751$ MHz, where $f_1 = f_0 - 15$ KHz and $f_2 = f_0 + 15$ KHz, are alternately fed to the maser input port 3b under the switching control of a 10 Hz square wave generator 26.

The two test signals $f_1$ and $f_2$ are generated in a switched synthesizer 28 which alternately generates signals of 20.420751 MHz and 20.390751 MHz in synchronism with the 10 Hz square wave generator, these signals being then mixed in an up-converter 30 with a 1400 MHz signal originating in a synthesizer 32. Both synthesizers 28 and 32 are referenced to the output of the voltage controlled oscillator 9. The resulting output signal from the up-converter 30 alternates between the two test signals $f_1$ and $f_2$ in synchronism with the 10 Hz square wave generator 26. The two test signals $f_1$ and $f_2$ are alternately fed to a second port 34b of the power combiner 34, the output of which is fed through the phase shifter 36 to the test input 3b of the cavity 3.

The response of the cavity 3 to the test signals of frequencies $f_1$ and $f_2$ is sensed in the detector 17 and the lock-in amplifier 19 to produce an output voltage level at the lock-in amplifier output 19a which is proportional to the differential response of the cavity 3 to the test signals. The lock-in amplifier 19 is switched in synchronism with the 10 Hz square wave generator 26 so that the response of the cavity to test frequencies $f_1$ and $f_2$ are synchronously detected.

Figure 3:
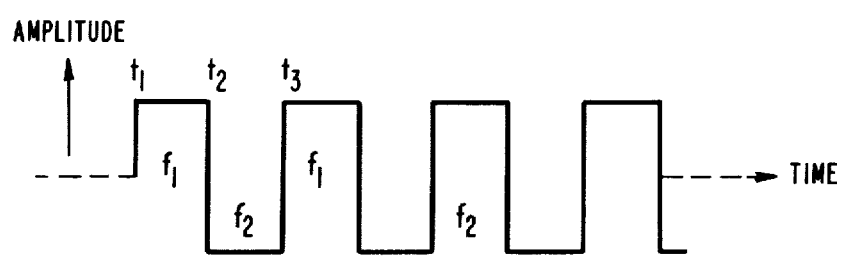
FIG. 3 is a diagram of the time domain waveform of the switch signal used in the frequency stabilization of FIG. 1.

Referring to FIG. 3, from time $t_1$ to time $t_2$ the square wave generator 26 generates a positive-going pulse, causing the switched synthesizer 28 and up converter 30 to produce the first test signal frequency $f_1$. At the same time the response of the cavity is measured by the lock-in amplifier which generates a minuend voltage proportional to the cavity response to the first test signal, the minuend voltage being temporarily stored inside the lock-in amplifier 19. From time $t_2$ to time $t_3$ the square wave generator 26 generates a negative-going pulse, causing the switched synthesizer 28 and up-converter 30 to generate the second test signal frequency $f_2$, while the corresponding response of the cavity is measured in the lock-in amplifier 19 which generates a subtrahend voltage which is proportional to the cavity response to the second test frequency $f_2$. The minuend and subtrahend voltages are subtracted in the lock-in amplifier 19 to produce a difference voltage level at the output 19a of the lock-in amplifier. The difference voltage level is integrated in the integrator 21 to produce a voltage which changes the junction voltage of the diode 15. In this manner, the junction capacitance of the diode 15 is changed so as to null the difference signal on the output 19a of the lock-in amplifier so that the resonant frequency of the cavity 3 is maintained halfway between the frequencies $f_1$, $f_2$ of the test signals, or equal to the radiation frequency $f_0$.

Figure 2:
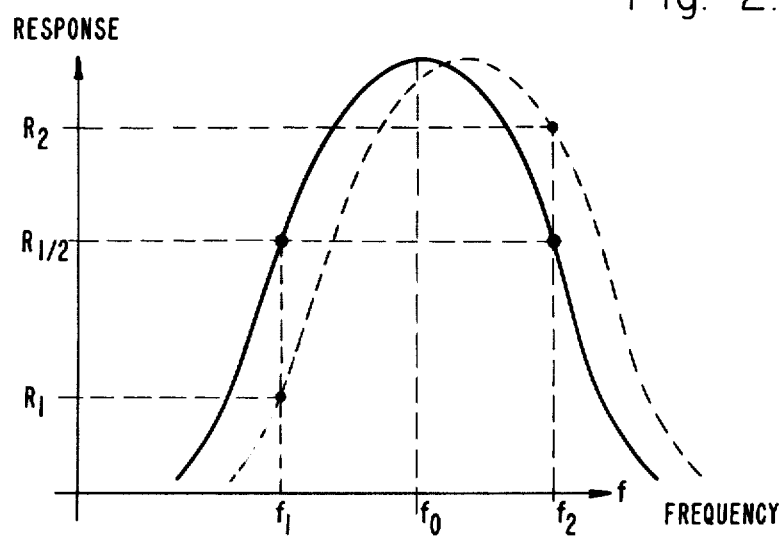
FIG. 2 illustrates the frequency response of the maser cavity of the device of FIG. 1.

Referring to FIG. 2, if the frequency response of the cavity 3 is precisely centered about the frequency $f_0$, then its response $R_{178}$ to each of the two test signals $f_1$ and $f_2$ will be the same, as illustrated in FIG. 2. On the other hand, if the resonant frequency of cavity 3 is shifted upwardly in frequency so that it is not centered about the frequency $f_0$ (as illustrated in dashed line in FIG. 2), its response $R_2$ to the test signal $f_2$ will be much greater than its response $R_1$ to the test signal $f_1$. Therefore, the lock-in amplifier 19 will produce a difference signal at its output 19a proportional to the difference $R_2 - R_1$ so that the output of the integrator 21 is automatically adjusted until the junction voltage of the diode 15 is such that the resonant frequency of cavity 3 equals $f_0$ and the difference signal present at the output 19a of the lock-in amplifier approaches zero. Similarly, if the resonant frequency of the system is centered below the frequency $f_0$, the lock-in amplifier will sense a difference of opposite polarity between the cavity responses to the two test signals $f_1$ and $f_2$, causing an opposite adjustment to the output of integrator 21 controlling the junction voltage of the diode 15 so as to increase the cavity resonant frequency until it is equal to $f_0$, at which time the output of the lock-in amplifier 19a will again approach zero.

In order to generate an electrical clock signal for external use, the voltage controlled oscillator 9 is regulated in a clock feedback control loop to be exactly in phase with the microwave radiation from the maser 1 as follows. The atomic radiation signal from the maser output 3a has a frequency $f_0$ equal to 1420.405751 MHz which is down-converted in two stages 20, 22 to 5751 Hz so as to provide a reference signal at reference input 11b of the phase detector 11. The voltage controlled oscillator 9 produces a 5 MHz signal at its output 9a which is converted by synthesizer 24 to the same frequency 5751 Hz, and this synthesized signal is fed to signal input 11c of the phase detector 11. The phase detector 11 produces an error voltage level $\Delta\phi$ at its output 11a which is proportional to the phase difference between the reference input 11b and the signal input 11c, and this error signal is fed back to the control input 9b of the voltage controlled oscillator 9. The phase detector 11 may be of any type well known in the art, such as those which are available from Hewlett-Packard, Inc. of Palo Alto, Calif. or may be custom designed by a skilled worker in the art. If the phase of the voltage controlled oscillator output signal at the output 9a begins to lead or lag the phase of the reference signal from the maser 1, the voltage applied to the control input 9b of the oscillator 9 will be either negative or positive, respectively, so that the phase of the output signal from the oscillator 9 is corrected to null the error voltage level $\Delta\phi$ produced at the phase detector output 11a.

The down-converted reference signal is produced as follows. The synthesizer 32 multiplies the 5 MHz output of the oscillator 9 to produce a 1400 MHz signal, which is subtracted in the down-converter 20 from the maser radiation signal of frequency $f_0$ to produce a first down-converted signal of frequency $f_a = 20.405751$ at the down-converter output 20a. A crystal bandpass filter 40 eliminates the test frequencies $f_1$ and $f_2$ to produce a pure signal of frequency $f_a = 20.405751$ MHz at the filter output 40a. A second synthesizer 33 synthesizes the 5 Mhz output of the oscillator 9 to produce a 20.4 MHz signal which is subtracted in a second down-converter 22 from the filtered output frequency $f_a$ to produce a second down-converted output signal of frequency $f_b = 5751$ at the second down-converter output 22, which is supplied to the phase detector 11 as the down-converted reference signal at its reference input 11b.

As previously mentioned, the synthesizer 24 takes the 5 MHz output of the oscillator 9 and converts it to a 5751 Hz signal which is supplied to the phase detector 11 at its signal input 11c. The phase detector 11 produces the phase error voltage level $\Delta\phi$ at its output 11a proportional the phase difference of the signals at its inputs 11b and 11c, which is fed back to the voltage controlled oscillator 9 at its control input 9b so as to accurately regulate the phase of the oscillator 9 to be in phase with the atomic radiation output of the maser 1.

While the test frequencies $f_1$ and $f_2$ have been described as symmetrically straddling the maser resonance frequency $f_0$, a skilled worker may desire to introduce a small amount of assymmetry (by adjusting the synthesizer 28) in order to compensate for a frequency shift in the maser output signal due to collisions between radiating atoms.

The invention is generally useful in any cavitation device in which the cavity resonant frequency of the device needs to be stabilized at a selected frequency $f_0$ by means of a supplementary reactive element coupled to the cavity. Thus, the supplementary reactive element 15 need not be a varactor diode but can be any tunable reactive element having its reactance controlled in a feedback control loop using a feedback error signal proportional to the differential response of the cavity to two test signals having their frequencies $f_1$ and $f_2$ located symmetrically with respect to the selected frequency $f_0$. A significant advantage of the device is that the test frequencies $f_1$ and $f_2$ may be sufficiently removed from the selected frequency $f_0$ so that the test signals do not interfere with detection or measurement of the radiation at the center frequency $f_0$.

What is claimed is:

1. A resonator having its frequency response centered about a selected frequency $f_0$ comprising:
   an electromagnetically resonant cavity;

a tunable reactive element connected to said cavity so as to provide a reactive load for said cavity;

means for introducing into said cavity two test signals of frequencies $f_1$ and $f_2$ not equal to said selected frequency $f_0$;

means for generating an error signal proportional to the differential response of said cavity to said two test signals; and means responsive to said generating means for changing the reactance of said tunable element so as to null said error signal.

2. The device of claim 1 wherein said tunable reactive element comprises a varactor diode having one of its anode and cathode electrically coupled to said cavity.

3. The device of claim 1 wherein said test signals have frequencies $f_1 = f_0 - \Delta$ and $f_2 = f_0 + \Delta$.

4. The device of claim 1 wherein said generating means comprises a radiation detector connected to said cavity, means responsive to said detector for generating minuend and subtrahend signals proportional to the response of said cavity to each of said test signals and means for generating a difference signal level from said minuend and subtrahend signals.

5. The device of claim 4 wherein said means for changing the reactance of said tunable element comprises an integrator connected to receive said difference signal and connected to supply a bias voltage to said diode so as to change the junction voltage of said diode in response to said difference signal.

6. In a maser stimulating coherent radiation of frequency $f_0$ using a maser cavity having losses sufficiently large that natural oscillation cannot be sustained, a device for providing self-sustained oscillation in said maser, comprising:

means for feeding back at least a portion of the output signal of said maser into said cavity in coherent phase relationship with radiation in said cavity;

a tunable reactive element coupled to said cavity to provide a reactive load for said cavity;

means for introducing into said cavity two test signals of frequencies $f_1$ and $f_2$, respectively, which are not equal to said frequency $f_0$;

means for generating an error signal proportional to the differential response of said cavity to said two test signals; and means responsive to said error signal for changing the reactance of said element so as to null said error signal.

7. The device of claim 6 further comprising:

a voltage controlled oscillator having an output signal, and means responsive to said coherent radiation for regulating the phase of said oscillator to be equal to the phase of coherent radiation produced by said maser.

8. The device of claim 7 wherein said oscillator phase regulating means comprises:

a down-converter and bandpass filter connected to detect the coherent radiation from said maser so as to produce a down-converted reference signal of a selected down-converted frequency having a first phase corresponding to the phase of said maser radiation;

a synthesizer connected to receive the output signal of said oscillator so as to generate a synthesized signal of said selected down-converted frequency having a second phase corresponding to the phase of the oscillator output signal;

phase detector means responsive to said reference signal and to said synthesized signal for generating a phase error signal proportional to the difference between said first and second phases; and means responsive to said phase error signal for changing the phase of said oscillator so as to null said phase error signal.

9. The device of claim 8 wherein said bandpass filter excludes frequencies corresponding to said test signal frequencies $f_1$ and $f_2$.

10. The device of claim 6 wherein said test signals are each sufficiently removed in frequency from $f_0$ so as not to distort the maser radiation of frequency $f_0$.

11. The device of claim 10 wherein $f_1$ and $f_2$ correspond to the half-power frequencies of said maser cavity.

12. A clock standard including a maser for supporting atomic oscillation of frequency $f_0$, comprising:

A. an oscillation cavity having an input port and an output port available to supply a maser output signal of frequency $f_0$ at said output port;

B. an amplifier having its input connected to said output port;

C. means for providing oscillation-sustaining feedback of said frequency $f_0$ to said maser, said means including:
 (1) a signal combiner having two inputs, one of said combiner inputs connected through an attenuator to the output of said amplifier,
 (2) a phase shifter connected between the output of said signal combiner and said cavity input port;

D. means for generating an output clock signal having a clock frequency in synchronism with said maser output signal, said generating means including:
 (1) a voltage controlled oscillator having a control input and a clock signal output,
 (2) a first synthesizer having its input connected to said oscillator output so as to produce a first synthesized signal in synchronism with said clock signal output,
 (3) a first down-converter having two inputs, one of said first converter inputs connected to the output of said first synthesizer, the other connected to the output of said amplifier so as to produce a first down-converted signal of frequency $f_a$ in synchronism with said maser output signal,
 (4) a second synthesizer having its input connected to said oscillator output so as to produce a second synthesized signal in synchronism with said clock signal output,
 (5) a second down-converter having two inputs, one of said second converter inputs connected through a bandpass filter to the output of said first converter, the other connected to the output of said second synthesizer so as to produce a second down-converted signal of frequency $f_b$ in synchronism with said maser output signal,
 (6) a third synthesizer having its input connected to said oscillator output so as to produce a third synthesized signal of said frequency $f_b$ in synchronism with said oscillator output, and
 (7) a phase detector having two inputs and an output, one of said inputs connected to the output of said third synthesizer, the other connected to the output of said second down-converter, said phase detector output connected to said oscillator control input so as to feed to said oscillator control input a phase error signal $\Delta\phi$ proportional to the phase difference between said second down-converted signal and said third synthesized signal; and E. means for stabilizing the resonant frequency of said cavity, said stabilizing means including:
   (1) a square-wave generator,
   (2) synthesizer means receiving said oscillator clock signal and alternately feeding two test signals of frequencies $f_1$, $f_2$ in synchronism with said square-wave generator to the other input of said signal combiner so that said test signals are alternately injected into said cavity through said phase shifter,
   (3) a detector having its input connected to the output of said amplifier to receive said amplified maser output signal,
   (4) a lock-in amplifier, in cooperation with said detector to measure cavity response to, each one of said two test signal frequencies $f_1$, $f_2$ in synchronism with said square-wave generator so as to generate a difference signal proportional to the differential response of said cavity to said two test signals,
   (5) an integrator connected to receive said difference signal, and
   (6) a varactor diode having two ends, one of said ends connected to receive the output of said integrator and the other of said ends connected to said cavity so as to provide a reactive load thereto.

13. The device of claim 12 wherein said oscillation cavity contains state-selected hydrogen atoms and said maser radiation frequency $f_0$ is on the order of 1420.405751 MHz.

14. The device of claim 13 wherein said clock frequency produced by said voltage controlled oscillator is on the order of 5 MHz, said first, second and third synthesized signals have frequencies on the order of 1400 MHz, 20.4 MHz and 5751 Hz, respectively, and said first and second down-converted signal frequencies, $f_a$ and $f_b$, have frequencies on the order of 20.405751 MHz and 5751 Hz, respectively.

15. The device of claim 14 wherein said first and second test signal frequencies $f_1$, $f_2$ are on the order of the half-power resonant frequencies of said cavity.

16. The device of claim 15 wherein said first and second test signal frequencies $f_1$, $f_2$ are on the order of 1420.390751 MHz and 1,420.420751 MHz, respectively.

17. A maser atomic clock comprising:

A. a microwave cavity having an input port and an output port available to produce a maser output signal;

B. means for providing oscillation-sustaining feedback to said maser cavity including:
   1. amplifier and attenuator means for selecting a portion of the signal present at said output port,
   2. signal combiner and phase shifter means connected to receive said selected signal portion from said attenuator means and for feeding back said signal portion to said input port in coherent phase relationship with said maser output signal;

C. means for generating an output clock signal in synchronism with said maser output signal including:
   1. means for producing a clock signal having a clock frequency less than that of said maser output signal and having a control input for changing the phase of said clock signal,
   2. down-converter means connected to receive the output signal at the output port of said maser cavity so as to produce a down-converted maser signal having a reference frequency less than that of said maser output signal and in phase therewith,
   3. means synthesizing said clock signal to produce a converted clock signal having a frequency equal to said reference frequency,
   4. means for producing an error signal proportional to the phase difference between said down-converted maser signal and said converted clock signal and for applying said error signal to said control input of said clock signal generating means; and, C. means for stabilizing the resonant frequency of said cavity including:
   1. means for alternately synthesizing two test signals of different frequencies from said clock signal and for sending said alternately synthesized test signals through said combiner and phase shifter means into said cavity through said cavity input port,
   2. means connected to receive the maser output signal from said cavity output port for detecting the response of said cavity to each of said two test signals and for generating a difference signal proportional to the differential response of said cavity to said two test signals; and D. a diode having two ends, one of said ends connected to receive said difference signal and the other said ends connected to said cavity to provide a reactive load thereto.

* * * * *